(12) United States Patent
Yang

(10) Patent No.: US 10,045,448 B2
(45) Date of Patent: Aug. 7, 2018

(54) FLEXIBLE SCREEN MODULE AND ELECTRONIC DEVICE HAVING THE MODULE

(71) Applicant: SHENZHEN ROYOLE TECHNOLOGIES CO. LTD., Shenzhen (CN)

(72) Inventor: Songling Yang, Shenzhen (CN)

(73) Assignee: SHENZHEN ROYOLE TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 15/521,059

(22) PCT Filed: Oct. 29, 2014

(86) PCT No.: PCT/CN2014/089773
§ 371 (c)(1),
(2) Date: Apr. 21, 2017

(87) PCT Pub. No.: WO2016/065549
PCT Pub. Date: May 6, 2016

(65) Prior Publication Data
US 2017/0311461 A1   Oct. 26, 2017

(51) Int. Cl.
*H05K 7/00* (2006.01)
*H05K 5/00* (2006.01)
*H05K 5/02* (2006.01)

(52) U.S. Cl.
CPC ......... *H05K 5/0217* (2013.01); *H05K 5/0204* (2013.01)

(58) Field of Classification Search
CPC ...................................................... H05K 1/28
(Continued)

(56) References Cited

U.S. PATENT DOCUMENTS

2007/0211036 A1* 9/2007 Perkins ................. G06F 1/1615
345/173
2008/0049003 A1* 2/2008 Hasegawa ............. G06F 1/1615
345/206

(Continued)

FOREIGN PATENT DOCUMENTS

CN          101238426 A     8/2008
JP           49-18537        2/1974
(Continued)

OTHER PUBLICATIONS

Office Action dated Feb. 6, 2018 from corresponding application No. JP 2017-523855.
(Continued)

*Primary Examiner* — Jerry Wu
(74) *Attorney, Agent, or Firm* — Hauptman Ham, LLP

(57) ABSTRACT

A flexible screen module includes a casing, a flexible screen, a bracket, and a support member. The casing has an opening. The first rotating shaft has an axial direction and is accommodated in the casing. The flexible screen is capable of being wound around the first rotating shaft and is capable of being unwound from the first rotating shaft and extended out of the casing through the opening. A bracket is fixed to the flexible screen and is capable of being wound around the first rotating shaft along with the flexible screen. The bracket supports the flexible screen in the axial direction. A support member is capable of being wound in the casing and is capable of being extended out of the casing along with the flexible screen, the support member has a curve memory characteristic in the axial direction.

20 Claims, 5 Drawing Sheets

(58) Field of Classification Search
USPC .................................................. 361/679.21
See application file for complete search history.

(56) References Cited

U.S. PATENT DOCUMENTS

2011/0011542 A1    1/2011  Kuroi
2016/0282899 A1*   9/2016  Inagaki ................... G04G 9/04

FOREIGN PATENT DOCUMENTS

| JP | 58-77331   | 5/1983 |
| JP | 9-160129   | 6/1997 |
| JP | 10-221780  | 8/1998 |
| JP | 3119961    | 3/2006 |
| JP | 2011-22260 | 2/2011 |

OTHER PUBLICATIONS

Extended European search report issued in corresponding European application No. 14 90 4978.5 dated May 8, 2018.

\* cited by examiner

FLEXIBLE SCREEN MODULE AND ELECTRONIC DEVICE HAVING THE MODULE

TECHNICAL FIELD

The present disclosure relates to a flexible screen, and particularly to a flexible screen module and an electronic device having the module.

BACKGROUND

Existing mainstream screen module includes Liquid Crystal Display (LCD) module and Organic Light-Emitting Diode (OLED) module. The above two kinds of screen modules both have rigid glass substrates and therefore cannot be curved. Recently, due to the emergence of flexible OLED screen, the form of the screen module is no longer limited to the traditional plane. For example, the flexible screen may be rolled up like curtains. Since the screen is not rigid, when the screen is stretched out, it is related to a problem of how to support and fix the screen.

One existing manner is to provide rotatable support rods on two opposite sides of an opening through which the flexible screen is stretched out. Before the flexible screen is pulled out, the two support rods are overlapped with each other. After the flexible screen is stretched out, the two support rods are rotated towards the direction of stretching the flexible screen to positions parallel to each other, so as to support the flexible screen. However, in this process, after the flexible screen is pulled out, it is necessary to manually rotate the support rods and fix them with the flexible screen, which is inconvenience. In addition, parts of the flexible screen not supported by the support rods are prone to deformation, which is unfavorable to the operation of the user.

SUMMARY

Embodiments of the present disclosure provide a flexible screen module for ease of use and an electronic device having the flexible screen module.

A flexible screen module includes a casing, a flexible screen, a bracket, and a support member. The casing has an opening. A first rotating shaft has an axial direction and is accommodated in the casing. The flexible screen is capable of being wound around the first rotating shaft and is capable of being unwound from the first rotating shaft and being extended out of the casing through the opening. The bracket is fixed to the flexible screen and is capable of being wound around the first rotating shaft along with the flexible screen; the bracket supports the flexible screen in the axial direction. The support member is capable of being wound in the casing and being extended out of the casing along with the flexible screen. The support member has a curve memory characteristic in the axial direction. When located outside the casing, the support member is coupled with the bracket to support the bracket in the direction in which the flexible screen is extended.

There is provided an electronic device having the flexible screen module described above.

In the present disclosure, since the support member has a curve memory characteristic in the axial direction of the first rotating shaft, when it is extended to the outside of the casing along with the flexible screen, the support member may be curved in the axial direction of the first rotating shaft, and in the direction substantially perpendicular to the axial direction, the support member is not easy to be curved because of certain rigidity thereof. Therefore, the support member can cooperate with the bracket to support the flexible screen. Meanwhile, since the support member is coupled with a plurality of brackets once it is extended out of the casing, there is no need to manually couple them, and consequently, it is easy to operate.

BRIEF DESCRIPTION OF THE DRAWINGS

The following figures are used in conjunction with the embodiments to describe various embodiments of the present disclosure in detail. It should be understood that various elements schematically illustrated in the figures do not represent an actual size or proportional relationship, but are merely schematic views for clear description, and should not be construed as limiting the present disclosure.

DETAILED DESCRIPTION OF ILLUSTRATED EMBODIMENTS

In order to make objects, technical solutions and advantages of the present disclosure more clear, in the following, the present disclosure is further described in detail in conjunction with a plurality of embodiments and the figures. It should be understood that the embodiments described herein are merely for illustrating the present disclosure rather than limiting the present disclosure.

Figure 1:
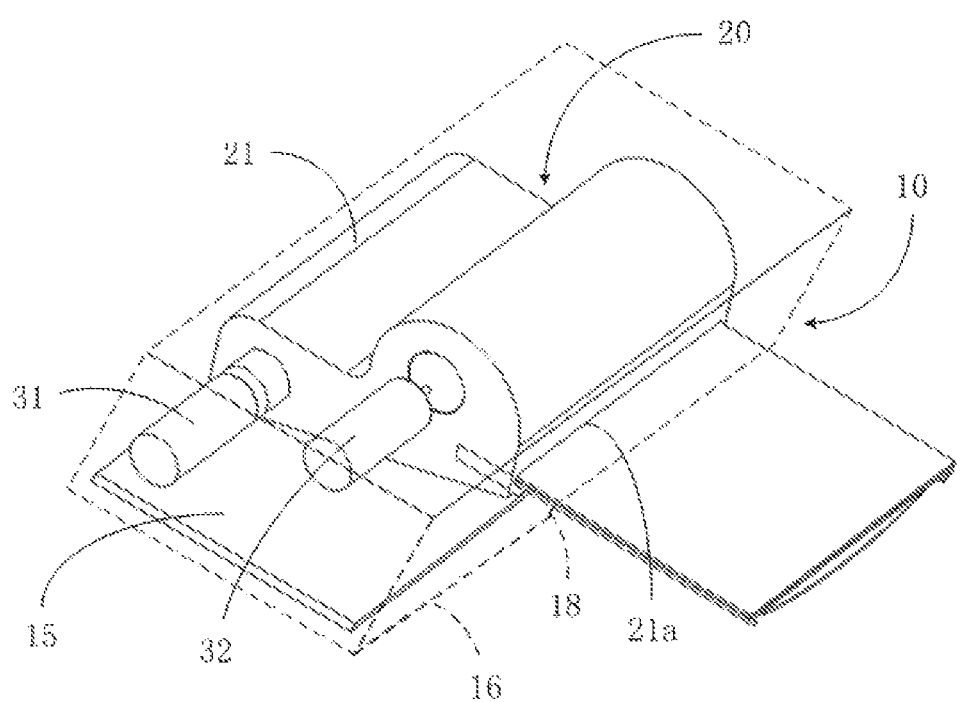
FIG. 1 is a schematic view of an electronic device having a flexible display module according to a first embodiment of the present disclosure.

Referring to FIG. 1, FIG. 1 is a structural schematic view of an electronic device 10 according to a first embodiment of the present disclosure. The electronic device 10 includes a housing 16, and a circuit board 15 and a flexible display module 20 housed in the housing 16. The housing 16 has an outlet 18. The flexible screen of the flexible module 20 may be rolled up or unwound. When the flexible screen being unwound, it may be extended out of the housing 16 through the outlet 18 for viewing by the user.

Figure 2:
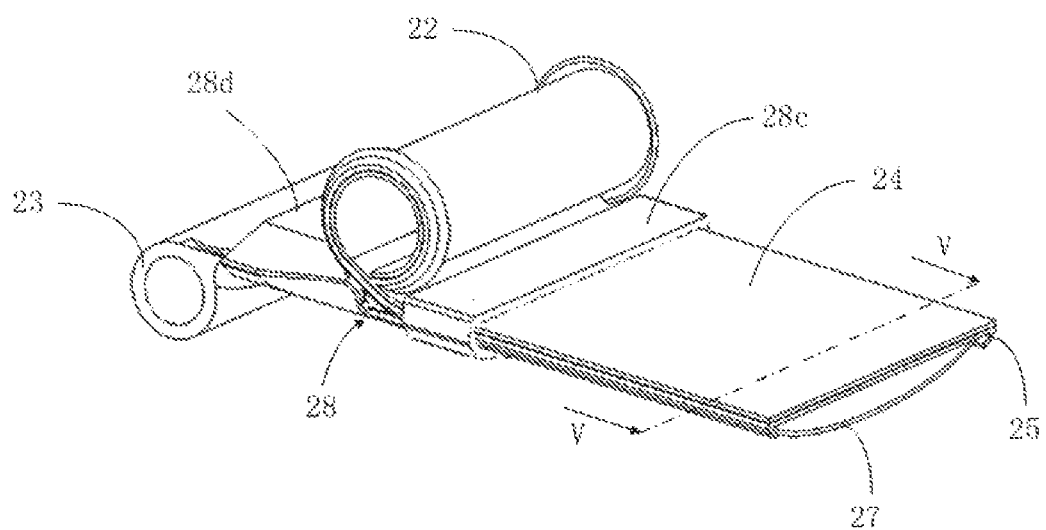
FIG. 2 is a structural schematic view of the flexible display module of the electronic device in FIG. 1 without the casing.
Figure 3:
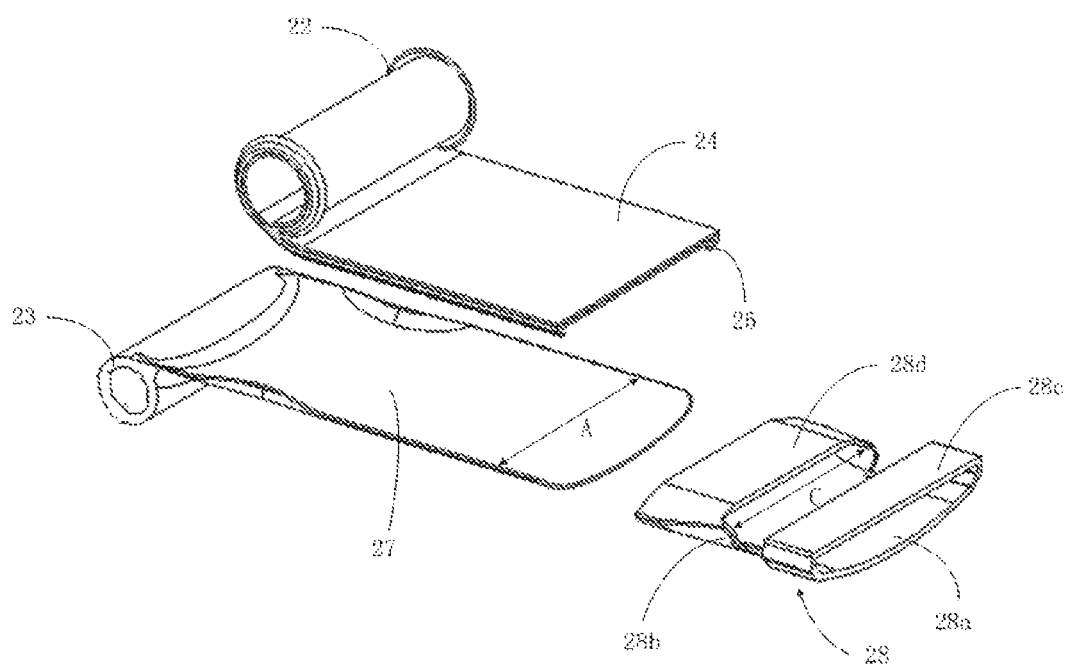
FIG. 3 is a partial exploded structural schematic view of the flexible display module in FIG. 2, which illustrates a schematic diagram of the support member portion after being squeezed.

Referring to FIGS. 2-3, the flexible screen module 20 includes a casing 21, a first rotating shaft 22, a second rotating shaft 23, a flexible screen 24, a bracket 25, a support member 27, and a buckling member 28. The casing 21 is provided with one opening 21a on one side thereof. The first rotating shaft 22 and the second rotating shaft 23 may be rotatably fixed in the casing 21, spaced apart from each other and substantially parallel to each other.

The flexible screen 24 is substantially square and has one front surface for displaying images and one back surface opposite to the front surface (not illustrated in FIGS. 2-3).

One side of the front surface of the flexible screen 24 is fixed to the first rotating shaft 22, and the portion being fixed may be a non-display area at the edge of a front display area. As such, the flexible screen 24 may be wound around the first rotating shaft 22, and may also be unwound from the first rotating shaft 22 and extended out of the casing 21 from the opening 21a.

Figure 4:
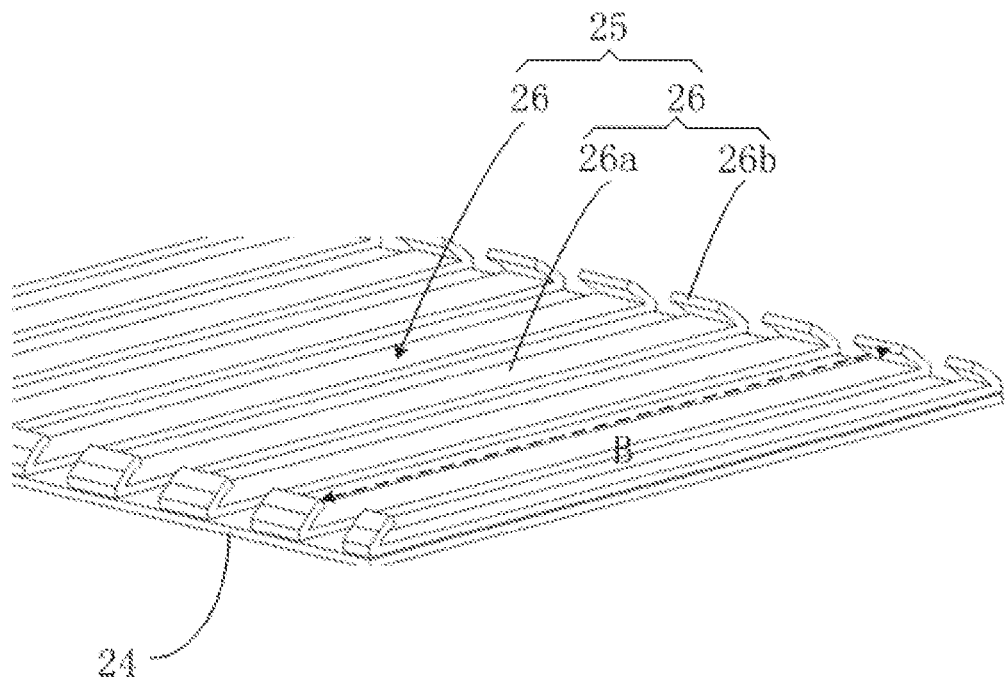
FIG. 4 is a schematic view of a bracket and a flexible screen of the display module in FIG. 2 in another viewing angle.

Referring to FIG. 4, the bracket 25 includes a plurality of rigid bracket bodies 26. The plurality of bracket bodies 26 are disposed to parallel to one side at which the flexible screen 24 is fixed to the rotating shaft 22 (i.e., the axial direction of the first rotating shaft 22), and are fixed to the back of the flexible screen 24 at intervals by adhesion or the like. As such, the plurality of bracket bodies 26 may be wound or unwound along with the flexible screen 24. Specifically, each of the bracket bodies 26 includes one main body 26a fixed to the back of the flexible screen 24 and two coupling parts 26b respectively located on two opposite sides of the main body 26a. The main body 26a is rectangular and extends along the axial direction of the first rotating shaft 22 so as to support the flexible screen 24 in the axial direction. The coupling parts 26b extend along the direction away from the flexible screen 24 and towards the middle of the back of the flexible screen, thereby the coupling parts 26b can be curved into an arc. The coupling parts may be formed by bending the main body.

It is to be noted that in other embodiments, when the bracket bodies 26 are provided with chamfers inclined to each other at two opposite sides of two adjacent bracket bodies, the adjacent bracket bodies 26 may not be spaced apart from each other, but may be disposed in close contact. Due to the provision of the chamfers, the plurality of bracket bodies 26 disposed closely may also be wound around the first rotating shaft 22.

Figure 5:
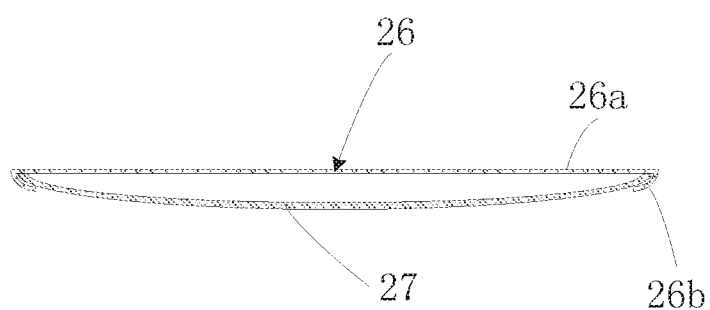
FIG. 5 is a schematic cross-sectional view of a display module in FIG. 2 along line V-V.

Referring to FIGS. 2-3, the support member 27 is a substantially rectangular. The support member 27 has a curve memory characteristic in the width direction thereof. The memory characteristic causes the support member 27 to remain curve in the width direction when it is not subjected to an external force, and the curve makes the support member 27 difficult to be bent, as illustrated by the support member 27 on the right side in FIG. 3. When the external force has removed after the support member 27 is bent by the external force, the portion of the support member 27 which is bent becomes flat and can remain in the state of bending and automatically winding, as illustrated by the support member 27 on the left side in FIG. 3, and the portion which is not bent remains curve in a certain degree. Distance A between the two sides in the width direction of the support member 27 in a curve state is larger than distance B between the two opposite coupling parts 26b of the bracket bodies 26 at the side away from the main body 26a (as illustrated in FIG. 4). In this way, the portion of the support member 27 which is being curved but is not bent is engaged with the bracket bodies 26 as illustrated in FIG. 5, that is, two sides of the support member 27 in the axial direction of the first rotation shaft 22 are engaged or accommodated in a space surrounded by the arc coupling parts 26b and the main body 26a, so as to support the bracket bodies 26 stretching out of the casing 21 in the direction in which the flexible screen 24 is extended. The portion of the support member 27 which is bent is wound around the second rotating shaft 23. The support member 27 may be made of a metal having a memory characteristic, such as a nickel-titanium alloy.

The buckling member 28 includes a base 28a, two oppositely disposed squeezing parts 28b, and a substantially U-shaped pressing part 28c and a separating part 28d respectively located at two opposite sides of the two squeezing parts 28b. The squeezing parts 28b are fixed to the base 28a and extend to each other with a minimum pitch C smaller than distance B between the two opposite coupling parts 26b of the bracket bodies 26 at the side away from the main body 26a, so as to squeeze the support member 27. The base 28a and the pressing part 28c form a frame. The base 28a and the separating part 28d form another frame. The support member 27 passes through the pressing part 28c and the separating part 28d, and is squeezed by the squeezing parts 28b. The flexible screen 24 and the bracket 25 together pass through the pressing part 28c. The bracket 25 is coupled with the support member 27 in the pressing part 28c. The flexible screen 24 and the bracket 25 are located at one side of the separating part 28d which is opposite to the support member 27.

During assembling, one end of the support member 27 in the longitudinal direction is passed through the separating part 28d and is squeezed by the squeezing parts 28b, and the remaining portion is wound around the second rotating shaft 23. The flexible screen 24, together with the bracket 25, is wound around the first rotating shaft 22, the bracket bodies 26 at one end of the flexible screen sleeve the squeezed support member 27, and then the combination of the flexible screen 24, together with the bracket 25, and the support member 27 is passed through the pressing part 28c. The first and second rotating shafts 22, 23 are rotatably fixed to the casing 21 to complete the assembling of the flexible display module 15. Finally, the flexible display module 15 is assembled in the housing 16 of the electronic device 10 and the signal connection associated with the circuit board 15 is completed. The outlet 18 is aligned with the opening 21a so that the flexible screen 24 can be extended out of the housing 16.

During operation, when the flexible screen 24 is needed to display an image, the flexible screen 24 can be pulled out manually by the user, in this case, a component fixedly connected with one side of the support member 27 and the flexible screen 24 that are adjacent to the outlet 18 may be disposed at the outside of the outlet 18 to be used for pulling. Alternatively, the flexible screen 24 can be pulled out in an electric manner; the second rotating shaft 23 may be driven by a motor 31 (illustrated in FIG. 1) fixed to the casing 21 to cause the support member 27 to drive the flexible screen 24 to extend outwardly, and in this case, the support member 27 close to one side of the outlet 18 is required to be fixedly connected with the bracket body 26. Of course, it may not be fixed, in which case the first rotating shaft 22 may be driven by another motor 32. As the flexible screen 24 and the support member 27 are extended outwardly, the portion of the support member 27 which moves to the squeezing parts 28b is squeezed and becomes narrower in width than the distance between the two opposite coupling parts 26b at the side of the coupling parts which is away from the main body 26a.

When the flexible screen 24 and the support member 27 continue to be extended outwardly, the flexible screen 24 and the bracket bodies 26 will approach the support member 27 under the action of the pressing part 28c, so that the squeezed support member 27 can enter the space half-surrounded by the bracket bodies 26. As the flexible screen 24 and the support member 27 continue to be extended outwardly, the support member 27 is gradually moved away from the squeezing parts 28b to return to the original curve state, and is engaged or accommodated in the space surrounded by the arc coupling parts 26b and the main body 26a, so as to be coupled with the bracket bodies 26 and extended out of the outlet 18. When the flexible screen 24 is not needed, it can also be retracted into the housing 16 in a manual or electric manner. This process is contrary to the above-mentioned pull-out process and may be understood by those skilled in the art from the foregoing description, and is not described herein.

The support member 27 has a curve memory characteristic in the axial direction of the first rotation shaft 22. When the support member 27 is extended along with the flexible screen 24 to the outside of the casing 21, it will curve in the axial direction of the first rotation shaft 22; in a direction substantially perpendicular to the axial direction, the support member 27 has certain rigidity and therefore is difficult to curve, so as to cooperate with the bracket 25 to support the flexible screen 24. Meanwhile, since the support member 27 is coupled with the bracket 25 once it is extended out of the casing 21, there is no need to manually couple them, and therefore, it is easy to operate. Further, the arrangement of the bracket 25 serves to support the flexible screen 24 such that the flexible screen 24 is not easily to deform towards the support member 27.

The separating part 28*d* serves to separate the bracket 25 and the support member 27 before the bracket 25 is coupled with the support member 27. However, it may be understood that, in other embodiments, the flexible screen 24 and the bracket 25 substantially reach the squeezed support member 27 once they are unwound from the first rotating shaft 22, besides, the bracket 25 may also be smoothly coupled with the support member 27. In this case, the separating part 28*d* may be omitted.

The pressing part 28*c* serves to ensure that relative positions of the bracket 25 and the support member 27 are not changed within an area for coupling, thereby ensuring the successful coupling between the bracket 25 and the support member 27. However, it may be understood that the opening 21*a* of the casing of the flexible screen module or the outlet 18 of the housing of the electronic device may also serves as the pressing part 28*c* as long as it has an appropriate width. Therefore, in other embodiments, the pressing part 28*c* may be omitted.

As described in the above embodiments, the support member 27 will be bent and automatically wound upon being subjected to a force greater than a certain threshold value. Thus, in other embodiments, the second rotating shaft 23 may not be provided, and the support member 27 may be automatically retracted by the contact of the casing 21 or the housing 16 or other components after the flexible screen 24 is retracted.

Figure 6:
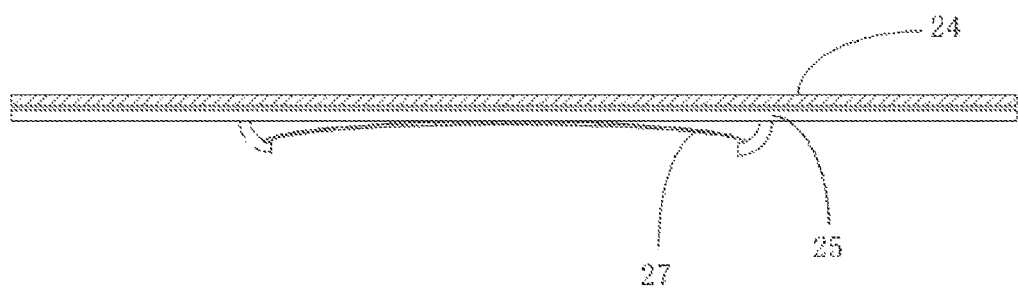
FIG. 6 is an interface schematic view of another embodiment of the flexible display module in FIG. 2.

In the embodiments described above, the support member 27 is coupled to two sides of the bracket 25. However, it should be understood that, in other embodiments, the support member 27 may also be coupled to a position close to the middle of the bracket 25, as illustrated in FIG. 6. In addition, in the embodiments described above, the support member 27 curves towards a direction away from the flexible screen 24 so as to make it difficult to be bent. However, it may be understood that the above effect will also be achieved when the support member 27 curves in a direction towards the flexible screen 24, as illustrated in FIG. 6.

Figure 7:
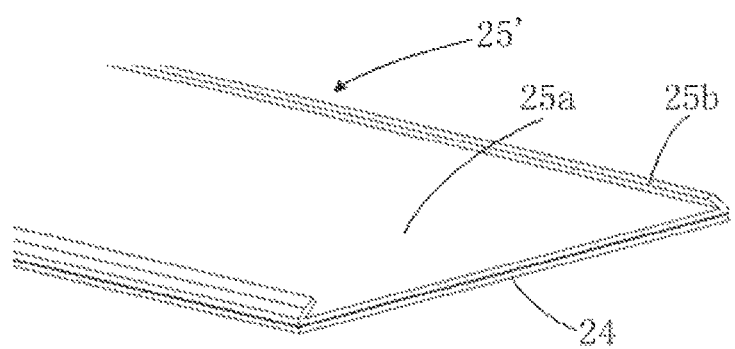
FIG. 7 is a schematic view of another embodiment of the bracket of the flexible display module in FIG. 2.

In other embodiments, instead of being composed of a plurality of bracket bodies 26 spaced apart, the bracket may have an integrated structure, such as a bracket 25' illustrated in FIG. 7. In this situation, the bracket 25' may be integrally molded from a material having elasticity, such as thermoplastic polyurethane elastomer rubber (TPU). When no external force is applied, coupling parts 25*b* on both sides of the bracket 25' curve towards the middle of the main body 25*a*. The functions of the coupling parts 25*b* are the same as those of the coupling parts 26*b* in the above-described embodiments. When the coupling parts 25*b* are wound together with the flexible screen, the coupling parts 25*b* are deformed and attached to the main body 25*a*, and thus the overall thickness after winding can be reduced. In addition, when the support member 27 is coupled with the bracket 25', the support member 27 is preferably in a compressed state in the axial direction of the first rotating shaft 22, thereby enhancing the resistance to deformation of the main body 25*a*. Of course, the situation in which the support member 27 is compressed is also applicable to the above-described bracket bodies 26.

In the above-described embodiments, the support member 27 is combined with the bracket 25 by engaging. However, it may be understood that, in other embodiments, when either of the bracket 25 and the support member 27 is provided as a magnetic material while the other is provided as a permeability magnetic material, they may be coupled with each other directly by magnetic force. In this manner, it is also possible to achieve the object of the above-described embodiments. In this situation, the bracket 25 may not be provided with the coupling parts.

The arrangement of the casing 21 allows the flexible screen module to form a modular structure, and thus facilitate subsequent assembly in an electronic device. It should be understood, however, that the components in the flexible screen module except the casing 21 may be directly mounted in the housing 16 and the casing 21 may not be provided. Additionally, since the bracket 25 is fixed to the flexible screen 24, it is also possible that the bracket 25 being fixed to the first rotating shaft 22, which also allows the flexible screen 24 to be wound around the first rotating shaft 22.

The above is merely for preferable embodiments of the present disclosure and not intended to limit the present disclosure. Any modifications, equivalent substitutions and improvements and so on within the spirit and principle of the present disclosure should fall within the scope of protection of the present disclosure.

What is claimed is:

1. A flexible screen module, comprising: a casing comprising an opening; a first rotating shaft comprising an axial direction and being accommodated in the casing; a flexible screen capable of being wound around the first rotating shaft, and capable of being unwound from the first rotating shaft and extended out of the casing through the opening; a bracket fixed to the flexible screen and capable of being wound around the first rotating shaft along with the flexible screen, the bracket supporting the flexible screen in the axial direction; and a support member capable of being wound in the casing and capable of being extended out of the casing along with the flexible screen, the support member comprising a curve memory characteristic in the axial direction; when extended out of the casing, the support member being coupled with the bracket to support the bracket in a direction in which the flexible screen is extended; when wound into the casing, the support member being not coupled with the bracket.

2. The flexible screen module according to claim 1, further comprising a second rotating shaft rotatably accommodated in the casing, the support member being capable of being wound around the second rotating shaft.

3. The flexible screen module according to claim 2, further comprising a drive apparatus fixed to the casing, wherein the support member has one end fixed to the second rotating shaft, and the drive apparatus is configured to drive the second rotating shaft to rotate such that the support member is extended out of the casing or wound into the casing.

4. The flexible screen module according to claim 1, wherein the bracket comprises a plurality of bracket bodies disposed in the axial direction and fixed to the flexible screen.

5. The flexible screen module according to claim 1, wherein the bracket and the support member are coupled with each other via magnetic force.

6. The flexible screen module according to claim 1, further comprising a buckling member comprising squeezing parts disposed oppositely, the squeezing parts being configured to squeeze the support member in the axial direction such that the support member is coupled with the bracket.

7. The flexible screen module according to claim 6, wherein the support member curves towards a direction away from the flexible screen.

8. The flexible screen module according to claim 6, wherein the bracket comprises a main body fixed to the flexible screen and two coupling parts disposed oppositely in the axial direction, and two opposite sides of the support member which are located in the axial direction are coupled with the two coupling parts.

9. The flexible screen module according to claim 8, wherein the two coupling parts disposed oppositely are located on two sides of the main body in the axial direction.

10. The flexible screen module according to claim 6, wherein the support member is in a compressed state in the axial direction when the support member is coupled with the bracket.

11. The flexible screen module according to claim 8, wherein the buckling member further comprises a pressing part located at one side of the squeezing parts, and after being squeezed by the squeezing parts, the support member deforms into an original curve state in the pressing part and is coupled with the two coupling parts.

12. The flexible screen module according to claim 6, wherein the buckling member further comprises a separating part located at another side of the squeezing parts, and when the support member is moved towards the opening, the support member and the bracket are respectively located at two sides of the separating part before the support member is squeezed by the squeezing parts.

13. An electronic device, comprising a flexible screen module according to claim 1.

14. An electronic device, comprising: a housing comprising an outlet; and a flexible screen module accommodated in the housing and comprising: a first rotating shaft comprising an axial direction and accommodated in the housing; a flexible screen capable of being wound around the first rotating shaft and capable of being unwound from the first rotating shaft and extended out of the housing through the outlet; a bracket fixed to the flexible screen and capable of being wound around the first rotating shaft along with the flexible screen, the bracket supporting the flexible screen in the axial direction; and a support member capable of being wound in the housing and capable of being extended out of the housing along with the flexible screen; the support member comprising a curve memory characteristic in the axial direction, wherein, when extended out of the housing, the support member is coupled with the bracket to support the bracket in the direction in which the flexible screen is extended; when wound into the housing, the support member is not coupled with the bracket.

15. The electronic device according to claim 14, further comprising a second rotating shaft rotatably accommodated in the housing and a drive apparatus, wherein the support member has one end fixed to the second rotating shaft, the support member is capable of being wound around the second rotating shaft, and the drive apparatus is configured to drive the second rotating shaft to rotate such that the support member is extended out of the housing or wound into the housing.

16. The electronic device according to claim 14, wherein the bracket and the support member are coupled with each other via magnetic force.

17. The electronic device according to claim 14, further comprising a buckling member comprising squeezing parts disposed oppositely, the squeezing parts being configured to squeeze the support member in the axial direction such that the support member is coupled with the bracket.

18. The electronic device according to claim 17, wherein the bracket comprises a main body fixed to the flexible screen and two coupling parts disposed oppositely in the axial direction, and the support member is in a compressed state in the axial direction when two opposite sides of the support member which are located in the axial direction are coupled with the two coupling parts.

19. The electronic device according to claim 17, wherein the support member curves towards a direction away from the flexible screen.

20. The electronic device according to claim 18, wherein the buckling member further comprises a pressing part located at one side of the squeezing parts, and after being squeezed by the squeezing parts, the support member returns to an original curve state and is coupled with the two coupling parts in the pressing part.

* * * * *